April 11, 1967 J. B. SAINTON 3,314,024

HIGH EFFICIENCY AMPLIFIER AND PUSH-PULL MODULATOR

Filed March 25, 1964 2 Sheets-Sheet 1

INVENTOR.
JOSEPH B. SAINTON
BY
Nolte and Nolte
ATTORNEYS

HIGH EFFICIENCY AMPLIFIER AND PUSH-PULL MODULATOR

Filed March 25, 1964

INVENTOR.
JOSEPH B. SAINTON

BY

Nolte and Nolte

ATTORNEYS 3,314,024

HIGH EFFICIENCY AMPLIFIER AND PUSH-PULL MODULATOR

Joseph B. Sainton, Dallas, Tex., assignor to Continental Electronics Manufacturing Co., Dallas, Tex., a corporation of Texas Filed Mar. 25, 1964, Ser. No. 354,734
8 Claims. (Cl. 332—43)

This invention relates to high efficiency modulated power amplifiers, and in particular to a high efficiency modulator and screen modulated power amplifier. More specifically, the invention relates to amplifiers of the type commonly known as Doherty amplifiers and described in U.S. Patent No. 2,210,028.

The Doherty amplifier includes two triodes (called "carrier" and "peak" tubes) connected to a source of modulated waves so that the waves are impressed on the tubes in phase quadrature. The outputs of the tubes are connected to a common load so that one of the outputs is shifted in phase by ninety degrees. The carrier tube is biased substantially to cut-off and the peak amplifier tube is biased beyond cut-off so that it amplifies only those portions of the modulated carrier wave which are above the average level thereof. The load circuit impedance is half the impedance that would be used with the carrier amplifier if this tube were functioning as a conventional class B amplifier developing its full output. The characteristic impedance of the phase shifting network in the output circuit is made equal to twice the load impedance. When the amplitude of the exciting voltage is below the carrier level, only the carrier tube is operative and works into an effective load impedance equal to twice the impedance that would be used to develop full output therefrom. When the signal level is greater than the average carrier level, the peak tube operates and feeds additional power to the load. This increases the apparent load impedance and, since the phase shifting network connected to the load acts as a quarter wavelength line, the apparent increase in impedance of the load is converted into an apparent decrease in impedance at the output of the carrier tube. Under these conditions, when the carrier wave is modulated 100 percent, the peak amplifier supplies half the output power, the apparent load impedance of the carrier tube is equal to half the actual load impedance, and the carrier tube then supplies the remaining half of the required peak power. Thus, the two tubes supply four times as much power at 100 percent modulation peaks as is supplied by the carrier tube alone at the carrier level.

Amplifiers operating as described above, have the outstanding advantage of high operating efficiency. However, such amplifiers require that the carrier amplifier tube be operated under class B conditions in order to preserve the linearity of the driving wave at negative trough conditions. This results in plate efficiency lower than that which is attainable under class C conditions. Such amplifiers also require the driving stage to be operated at very low plate efficiency when no modulation is applied (hereinafter referred to as the "carrier only" condition) in order for the driving stage to be able to amplify modulated waves or be modulated itself by varying the grid voltage. This results in a very large driving stage as well as a low value of overall transmitter efficiency. Furthermore a conventional grid modulated Doherty amplifier requires a very large radio frequency driver stage because of the triode tube, its drive requirements, and the necessity of swamping it with a considerable amount of drive power in order to ensure a linear modulated wave. The Doherty amplifier also requires neutralization of both tubes in order to ensure the stability of the output carrier wave.

The prime consideration in designing a transmitter employing a high efficiency modulated power amplifier is to maintain high overall transmitter efficiency, that is, the ratio of power line input to radio frequency output. Although the modulator power requirement is small compared to the radio frequency power output, a high efficiency modulator is obviously still preferable. The conventional means for obtaining audio frequency power at high efficiency in the well known push-pull class "B" or class "AB" amplifier in which high efficiency is achieved by virtue of the fact that each tube is biased near cut-off and amplifies alternate half cycles of the balanced-to-ground driving wave. The outputs of the two tubes are combined in a transformer in the plate circuit. The design of this transformer for moderate power output is a formidable task, since to obtain good frequency response and low distortion, the transformer must have high winding inductance with little shunt capacitance, and very tight coupling between primary and secondary, and between primary halves, in order to minimize leakage inductance.

It is an object of this invention to improve the conventional Doherty amplifier and the control grid modulated Doherty amplifier by eliminating the undesirable features mentioned above.

It is another object of this invention to provide a high efficiency simple modulator circuit that dispenses with the use of an output transformer.

It is still another object of this invention to provide a high efficiency modulator and power amplifier.

Another object of this invention is to provide a Doherty type amplifier which requires no neutralization of its amplifier stages.

The above, and other objects which will become apparent hereinbelow, are attained in a preferred embodiment of the invention by the use of tetrodes in a Doherty type amplifier. The tetrodes require very little driving power and the modulation of their screen grids effectively isolates the modulating source from the driving source, thereby relieving the need to swamp the driving power to maintain linearity. The use of tetrodes also precludes the requisite neutralization of the prior art.

The two tubes are connected in such a way that the plate efficiency is higher than that realized in a single tube class "B" linear amplifier when used to amplify moduated waves. According to the invention, the carrier tube is operated as a conventional class "C" amplifier and therefore, operates at a very high plate efficiency. In addition, this tube being a tetrode, requires no neutralization and very little radio frequency driving power. The peak tube, is also operated as a class "C" amplifier so that it too operates at high efficiency when driven to modulation crest conditions. Although the triode tube formerly used was operated similarly, it demanded a larger driving power and required neutralization. The carrier waves are applied directly to the control grid of the peak tube, and through a ninety degree phase shifting network to the control grid of the carrier tube.

The modulation waves may be derived from a unique modulation circuit, which operates in a "push-pull" fashion as described, more fully hereinbelow. The outputs of the modulation circuit are applied to the screen grids of the carrier and peak tubes above mentioned.

A fuller understanding of the invention may be had by referring to the following description and claims, taken in conjunction with the accompanying drawings, in which:

For the sake of clarity, the amplifier circuit of the invention will be described first, and then a description of the modulator circuit will follow.

Figure 1:
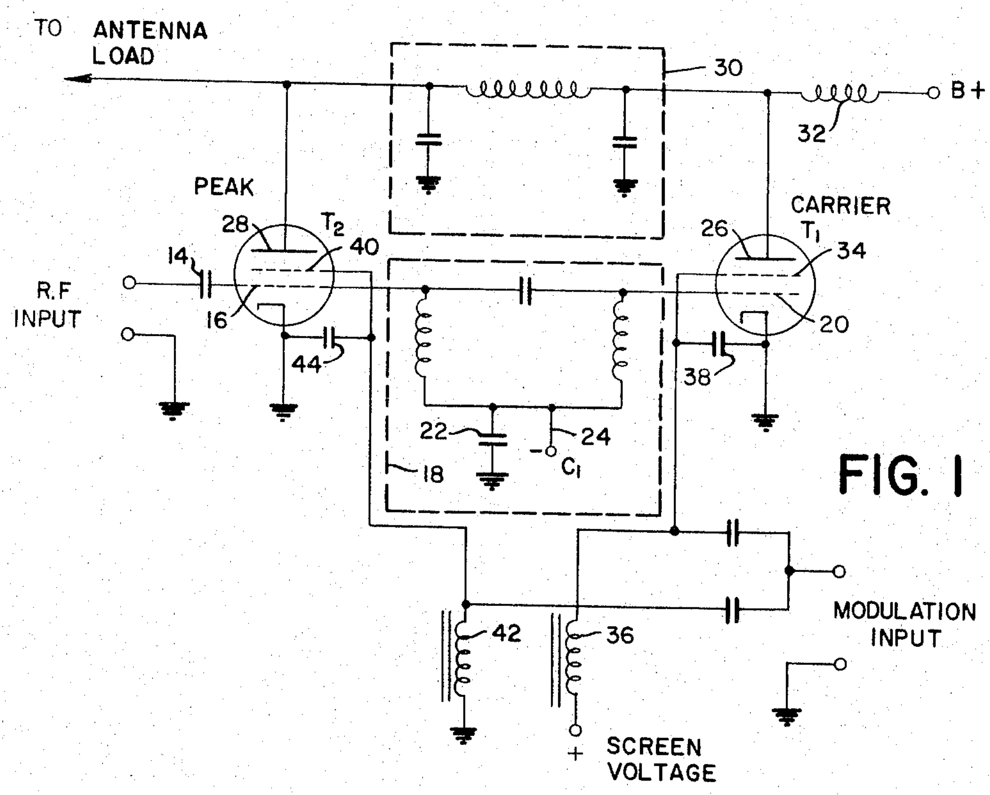
FIG. 1 is a simplified schematic of a screen modulated power amplifier circuit in accordance with the invention.

As shown in FIG. 1 the circuit according to the invention, includes carrier tetrode tube T1 and a peak tetrode T2. Carrier Tube T1 is a conventional tetrode including a cathode (not numbered), a control grid 20, a screen grid 34, and a plate 26. Tetrode T2 includes a cathode (not numbered), control grid 16, screen grid 40, and plate 28.

The radio frequency carrier wave is applied through a coupling capacitor 14 to the control grid 16 of peak amplifier tube T2. The control grid 20 of the carrier amplifier tube T1 is coupled to the grid 16 of the peak amplifier tube T2 through a ninety degree phase leading network 18 which is conventional. The purpose of this network 18, is to advance the phase of the carrier tube T1 driving voltage by ninety degrees in order that the carrier tube output voltage will combine in the proper phase in the load circuit with the peak tube T2 output voltage. The phase shifting network 18 is shown as a pi network, but it will be understood that any equivalent circuit adapted to produce a ninety degree phase shift may be used. In the configuration shown, the network is effectively grounded through a grid bias decoupling condenser 22. The control grids 16 and 20 of tubes T1 and T2, respectively, are supplied with a bias voltage C1 at terminal 24. The plate 26 of the carrier tube T1 is connected to the plate 28 of the peak tube T2 through a conventional ninety degree phase lagging network 30. Network 30 causes the plate load impedance of carrier tube T1 to decrease during positive crests of modulation due to the increase in output impedance of network 30 caused by the contribution of the peak tube T2 plate voltage swing. This results in an increase in carrier tube T1 power output during modulation, even though its plate voltage and plate voltage swing remains constant.

Voltage is applied to plates 28 and 26 from a B+ source through a customary radio frequency choke coil 32. The screen grid 34 of the carrier tube T1 is connected through a modulating impedance 36, preferably an iron core inductor, to a source of positive direct voltage. The magnitude of this direct voltage is sufficient to allow class "C" operation of the carrier tube T1 at full carrier output, with a given excitation applied to its control grid 20. The screen grid 40 of the peak tube T2 is connected through a modulating impedance 42, preferably an iron core inductor, to ground or cathode potential. This arrangement, in practice, will nearly cut off the plate current of the peak tube T2 even with control grid excitation applied, which means that in the carrier only condition (no modulation), the peak tube T2 will contribute little or nothing to the power output of the amplifier stage. Almost all of the power will therefore be contributed by the carrier tube T1 operating at class "C" efficiency.

The screen grids 34 and 40 of tubes T1 and T2 are held at ground or cathode potential in so far as the R.F. carrier is concerned by the use of respective bypass condensers 38 and 44 connected from the screens to ground. This ensures frequency stability of the output wave without any detrimental capacitive loading to the audio frequency (modulation) voltage applied to both screen grids. The establishment of the screen grids at radio frequency ground potential dispenses with the requirement of neutralization of either tube.

In order to achieve maximum power output from the circuit with 100 percent modulation of the carrier wave, the amplifier output voltage at positive peaks must be twice its carrier only level, which means that across a fixed load resistance the peak power will be four times its carrier only value; at negative crests, the amplifier output voltage must be zero. This assumes that the modulating wave has positive and negative crests which are symmetrical about the axis represented by the carrier only level. The above requirements can be readily met by the circuit illustrated in FIG. 1.

In operation, a carrier wave from a radio frequency input circuit (not shown) is supplied to the control grid 16 of the tube T2 and the control grid 20 of the tube T1. The voltages at the grids will be ninety degrees out of phase by virtue of the phase shifting network 18. The control grids 16 and 20 of tubes T2 and T1, respectively, are biased sufficiently beyond cutoff to cause tubes T1 and T2 to operate under class "C" conditions. A modulating voltage wave is applied simultaneously and in the same phase to the screen grids 34 and 40 of tube T1 and tube T2, respectively.

Considering only the positive crests of the modulating wave, the peak tube T2, which at carrier only condition, delivers little or no carrier power (since it is effectively cut off), now conducts and supplies power to the load circuit (not shown). The voltage on screen grid 40 increases with modulation until at modulation crest condition the peak tube screen voltage is sufficient to cause maximum excursion of its plate voltage swing into a load impedance equal to one half the carrier tube load impedance at carrier only condition. Therefore, tube T2 delivers twice the carrier power, measured at carrier only condition, into the load circuit.

The plate 26 of tube T1 supplies the load circuit through a ninety degree phase lagging network 30, the characteristic impedance of which is twice the load circuit impedance. While the peak tube T2 is supplying power to the load circuit, it is increasing the voltage across the load circuit relative to the current supplied by the carrier tube T1, causing an apparent increase of load circuit impedance. This apparent increase of load circuit impedance is reflected by the phase lagging network 30 to the plate 26 of the carrier tube T1 as an apparent decrease in load circuit impedance. In other words, since the carrier tube T1 is connected to the load circuit through a ninety degree lagging network, which has an impedance inverting characteristic, the result of the peak tube T2 delivering power to the load causes the plate load impedance seen by the carrier tube T1 to decrease with modulation. This allows the carrier tube T1 to deliver more power than attainable at carrier only condition. The ninety degree phase lagging circuit is designed to allow the carrier plate load impedance to halve at crest condition, which means that double the carrier only power can be delivered to the load impedance under these conditions. Thus, at crest condition, each tube is delivering twice the carrier power supplied under carrier only conditions. The total crest output power is therefore four times as much as the power supplied in the carrier only condition.

The peak tube T2 is not affected by negative troughs, since the tube cuts off at the carrier only level. The screen voltage of the carrier tube T1 is reduced by the negative troughs of the modulation voltage until its plate current is cut off at a point corresponding to the crest of the negative modulating waves.

Since the screen 40 of the peak tube T2 is held at cathode potential when no modulation is applied, and therefore contributes little or nothing to the power output of the amplifier, modulation of the peak tube screen voltage in a negative direction during trough conditions will accomplish nothing and is, therefore, unnecessary. Furthermore, since the peak tube T2 has the same saturation grid drive as the carrier tube, it is only necessary that its screen voltage be modulated in a positive direction until both the peak and carrier tubes have the same instantaneous screen voltages at crest conditions. The carrier tube need not be modulated in a positive direction since this will cause no increase in power output. Therefore, the two tubes require alternately positive and negative half cycles of the modulating wave, so that the peak tube T2 is modulated with the positive half cycles and the carrier tube T1 with the negative half cycles. In this arrangement, the separate modulator tubes which supply the alternate half cycles may operate similar to a push-pull amplifier at high efficiency, but without the necessity of a transformer in the plate circuit.

Figure 2:
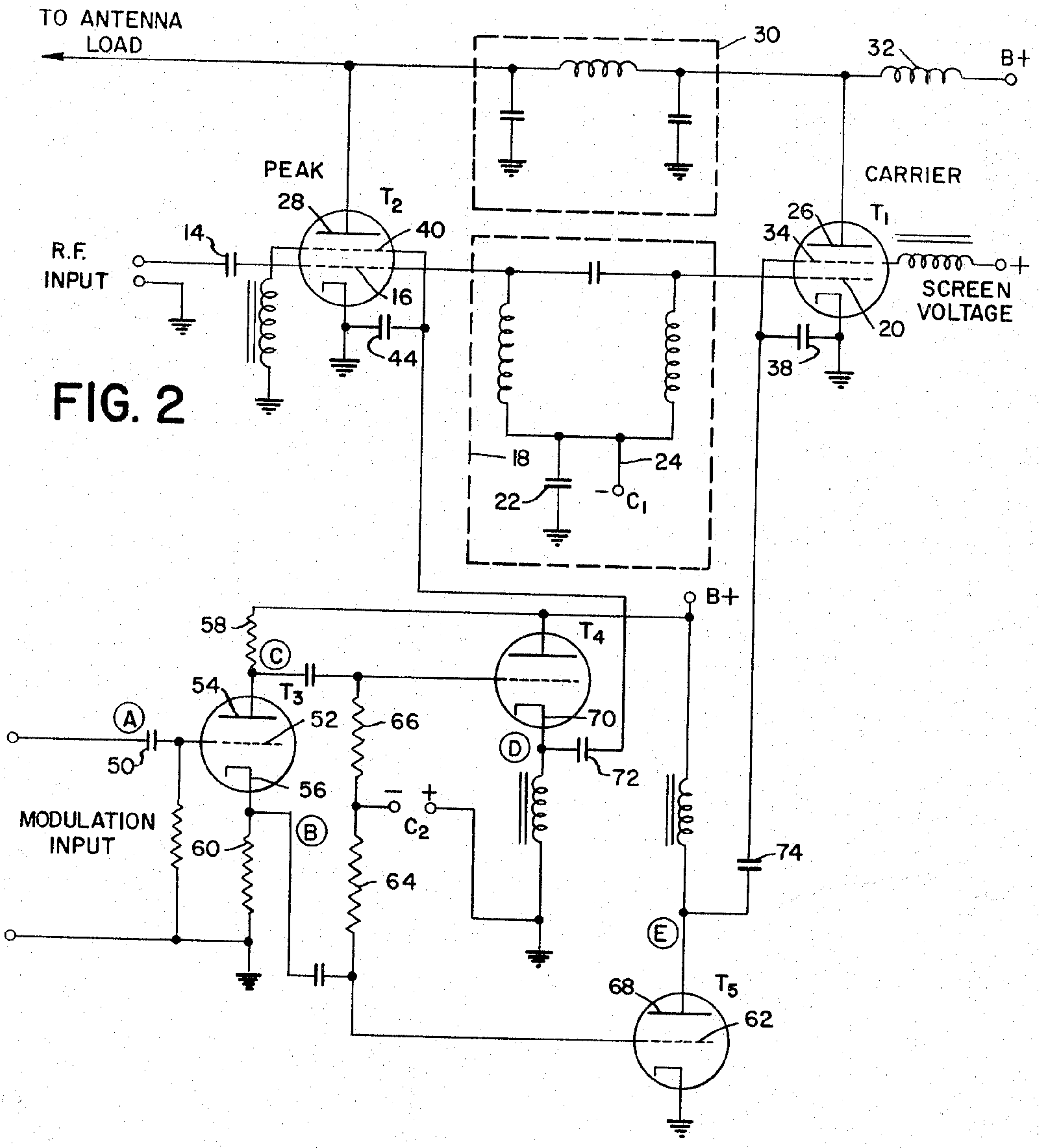
FIG. 2 is a simplified schematic of a high efficiency modulator circuit in conjunction with the high efficiency screen modulated power amplified circuit of FIG. 1.

The novel modulator circuit shown in FIG. 2 is particularly useful in applying the modulating waves to the amplifier circuit in the manner described above. Moreover, this modulator would have equal utility in circuits other than the specific combination described herein. With reference to FIG. 2, a modulation voltage (a sine wave for purposes of explanation), is fed through coupling condenser 50 to the grid 52 of a triode T3. Tube T3 functions as a conventional phase inverter in which an unbalanced input wave is transformed into one that is balanced with respect to ground potential; that is, a positive going wave impressed on the grid will result in positive going wave being derived from cathode to ground and a negative going wave being derived from plate to ground. The amplitude of the plate and cathode voltages can be adjusted by varying the values of the plate and cathode resistance 58 and 60, respectively, and, for reasons to be described later, the voltages are made unequal. A second triode T5 functions as the carrier tube modulator and is biased near cut-off by means of a bias voltage C2 supplied to its control grid 62 through resistor 64. Consequently, only a positive going grid voltage wave will cause an excursion of its plate voltage, that excursion being in a negative direction due to the 180 degree phase reversal of the output signal relative to the input signal. A third triode T4 is the peak tube modulator, and operates as a cathode follower, biased near cut-off by means of bias voltage C2 and resistor 66. Therefore, in regard to tube T4, only a positive going grid voltage wave will cause an excursion of its cathode voltage, that excursion being in a positive direction.

Since tube T4 is operated as a cathode follower, the tube will have a voltage gain of less than unity, and will therefore require a larger driving voltage than tube T5, which may have a voltage gain of twenty or more depending on the type of tube used. The voltage swing at the plate 54 of phase inverter T3 is thus made greater than its cathode voltage swing, by adjusting plate resistor 58 to a value considerably greater than that of the cathode resistor 60.

For purposes of illustration, assume that the amplitude of the half sine wave output of each modulator tube must be eight hundred volts peak positive for tube T4 and eight hundred volts peak negative for tube T5. If T4 has a voltage gain of 0.8, its grid swing must be one thousand volts peak. Assuming a voltage gain of twenty for tube T5, it will then require a swing of forty volts peak at the grid of tube T5. Therefore, tube T3 will have to have a plate swing twenty-five times greater than its cathode swing, and resistors 58 and 60 are adjusted accordingly.

Figure 3:
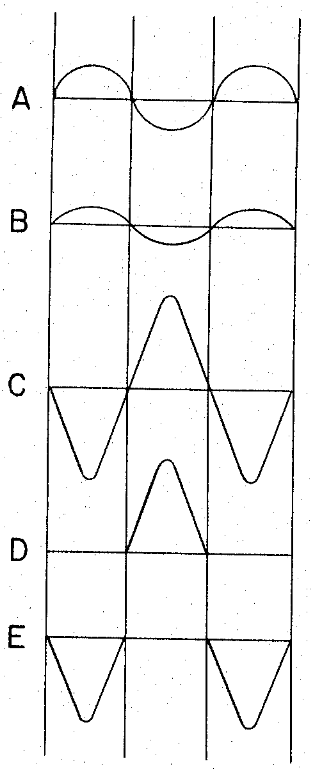
FIG. 3 are explanatory wave forms for the circuit of FIG. 2.

Referring now to the waveform diagrams of FIG. 3, waveform A shows a sine wave signal impressed on the grid 52 of tube T3. Waveform B is the positive output sine wave appearing between the cathode 56 of tube T3 and ground, the signal having an amplitude slightly less than that of the input signal shown in A. This signal is amplified by tube T5, and the result is the negative going half sine wave shown by waveform E. The amplified and inverted output of tube T3 is shown by waveform C, the initial large negative excursion applied to the grid 62 of tube T4 preventing conduction thereof. On the next half cycle, the negative going voltage of the input signal shown at A results in a large positive voltage at the plate 54 of tube T3. This positive half cycle produces a positive going half cycle at the cathode output of tube T4, as shown in chart D. There is no output at the plate 68 of tube T5 during this half cycle because this tube is biased to cutoff and is being driven by a negative voltage (see B). The output obtained from tube T4 is fed through capacitor 72 to the screen grid 40 of peak tube T2. The output obtained from tube T5 is fed through capacitor 74 to screen grid 34 of tube T1.

Since both modulator tubes are biased near cutoff, they require very little input power when there is no modulation applied and thus maintain high overall transmitter efficiency. At full modulation, they operate similar to push-pull class B modulators which also result in high efficiency operation.

For the sake of clarity and simplicity, the invention has been illustrated by simplified diagrams in which power supplies and other conventional elements and connections are omitted. It must be noted, therefore, that within the spirit and scope of the claims, many modifications and variations of the invention will be apparent to those skilled in this art.

What is claimed is:

1. A device for the high efficiency amplification and coupling of modulated carrier energy to a load, comprising a pair of amplifiers each having output terminals and first and second control grids; means for applying a carrier wave component to said first control grids, said means including means for imparting a ninety degree phase shift to the carrier wave component applied to the first grid of one of said amplifiers; means for applying a modulation wave to both of said second grids, said means including a first amplifying means for producing two output potentials 180 degrees apart, a second amplifying means having an input terminal connected to one output potential of said first amplifying means and an output terminal connected to the second grid of one of said amplifier pair, a third amplifying means having an input terminal connected to the second output potential of said first amplifying means and an output terminal connected to the second grid of the second of said amplifier pair, and means for biasing said second and third amplifying means substantially near cut-off; means connected between the load and the respective output terminals of each of said amplifiers for imparting a ninety degree phase shift to the output of said one amplifier; and means for biasing said amplifiers substantially below their plate current cut-off points.

2. A device according to claim 1, wherein the ninety degree phase shift imparted to the carrier wave component applied to said first grid is a leading phase shift and the ninety degree phase shift imparted to the output of said one amplifier is a lagging phase shift.

3. A device according to claim 2, in which each of said amplifiers is a tetrode.

4. A device according to claim 3, in which said means connected between the load and said output terminals has an impedance inverting characteristic.

5. A circuit for the amplification and coupling of modulating waves to a modulating amplifier, comprising a first amplifier having a control electrode responsive to audio frequency waves applied thereto and first and second output electrodes from which two output potentials 180 degrees apart in phase may be derived, the output from said first output electrode being 180 degrees out of phase with the signal applied to said control electrode; a second amplifier arranged in cathode follower configuration and having an input terminal connected to the first output electrode of said first amplifier for producing a first output signal for coupling to the modulating amplifier, a third amplifier having an input terminal connected to the second output electrode of said first amplifier for producing a second output signal for coupling to the modulating amplifier, and means for biasing said second and third amplifying elements substantially near cut-off.

6. A circuit according to claim 5, wherein said first, second and third amplifiers are triodes.

7. In combination; a modulator circuit including means responsive to a modulation input and producing a positive and negative signal therefrom, first amplifier means for amplifying the positive signals from said modulation circuit, and second amplifier means for amplifying the negative signal from said modulation circuit; a Doherty type amplifier circuit including a carrier amplifier having first and second control electrodes and an output electrode, a peak amplifier having first and second control electrodes and an output electrode, first phase shifting means connected between said first control electrodes, and second phase shifting means connected between said output electrodes, said first electrodes being responsive to a radio frequency carrier; and means for coupling the outputs of said first and second amplifier means to respective second control electrodes of said carrier and peak amplifiers.

8. A combination according to claim 7, wherein said means for coupling comprises capacitive coupling means.

References Cited by the Examiner

UNITED STATES PATENTS

| | | | |
|---|---|---|---|
| 2,210,028 | 8/1940 | Doherty | 330—84 |
| 2,488,567 | 11/1949 | Stodola | 330—117 X |
| 2,719,190 | 9/1955 | Raisbeck | 330—30 X |
| 2,965,710 | 12/1960 | Lee | 332—43 X |

ROY LAKE, *Primary Examiner.*

A. L. BRODY, *Assistant Examiner.*